United States Patent
Takacs et al.

(10) Patent No.: US 6,244,212 B1
(45) Date of Patent: Jun. 12, 2001

(54) ELECTRON BEAM EVAPORATION ASSEMBLY FOR HIGH UNIFORM THIN FILM

(75) Inventors: Laszlo A. Takacs, Shaker Heights; Robert E. Kusner, Solon; Gerald T. Mearini, Shaker Heights, all of OH (US)

(73) Assignee: Genvac Aerospace Corporation, Cleveland, OH (US)

( * ) Notice: Subject to any disclaimer, the term of this patent is extended or adjusted under 35 U.S.C. 154(b) by 0 days.

(21) Appl. No.: 09/475,936

(22) Filed: Dec. 30, 1999

(51) Int. Cl.[7] ..................................................... C23C 16/00
(52) U.S. Cl. .................. 118/723 EB; 118/727; 118/729
(58) Field of Search ............................ 118/727, 723 EB, 118/723 VE, 729

(56) References Cited

U.S. PATENT DOCUMENTS

| | | | |
|---|---|---|---|
| 3,575,132 | * 4/1971 | Francisco et al. | 118/49.5 |
| 4,042,128 | 8/1977 | Shrader . | |
| 4,233,937 | * 11/1980 | Steube | 118/727 |
| 4,748,935 | * 6/1988 | Wegmann | 118/723 |
| 4,868,003 | 9/1989 | Temple et al. . | |
| 5,514,217 | 5/1996 | Niino et al. . | |
| 5,518,597 | 5/1996 | Storer et al. . | |
| 5,520,740 | 5/1996 | Kani et al. . | |

* cited by examiner

Primary Examiner—Richard Bueker
(74) Attorney, Agent, or Firm—Fay, Sharpe, Fagan, Minnich & McKee, LLP

(57) ABSTRACT

An apparatus and method for improving the performance of a vacuum coating system includes a vacuum chamber enclosing a track. The track is substantially rectangular having a top surface and a bottom surface. A pair of legs are attached to the bottom surface of the track and support the track within the vacuum chamber. The legs have a top edge engaging the bottom surface of the track and a bottom edge secured to a bottom section of the vacuum chamber. The legs extend longitudinally along the bottom surface of the track. A rail is mounted on the top surface of the track and extends along a longitudinal axis of the track. A substantially planar platter having a top face and a bottom face is supported on top of the rail. The platter is adapted to slide from side to side along the rail across the length of the track. A stage carrying an electron beam evaporator is mounted on the top face of the platter. As such, the electron beam evaporator slides with the platter across the length of the track. A linear substrate feed assembly is disposed above the stage for feeding a substrate through the vacuum chamber. As the substrate travels through the vacuum chamber, it is coated by a deposition material transmitted from the electron beam evaporator.

18 Claims, 2 Drawing Sheets

ELECTRON BEAM EVAPORATION ASSEMBLY FOR HIGH UNIFORM THIN FILM

BACKGROUND OF THE INVENTION

1. Field of the Invention

This invention pertains to an apparatus and method for improving the performance of vacuum deposition systems. More particularly, the invention relates to an electron beam evaporator mounted onto a moveable stage capable of depositing layers of coatings uniformly onto substrates of various sizes during in-line processing.

2. Discussion of the Art

The coating of substrates within a vacuum has been recognized for some time as being a highly advantageous technique in many applications. For example, vacuum coating may be used for achieving anti-reflection and anti-abrasion properties, non-metallic coatings, zinc or aluminum coated papers and plastics, refined high pressure metals, and various other applications where high purity or unusual alloy compositions are desirable.

One type of coating system includes a vacuum tight enclosure or chamber connected to a vacuum pump. Inside the chamber is a vapor source generally consisting of a crucible or boat. The crucible is water-cooled and contains an evaporant, such as molten metal, with which the substrate is to be coated. The substrate is also housed by the vacuum chamber and is usually supported by holders. The evaporant is heated within the crucible producing a vapor cloud which acts as a transport media to deposit the evaporant on the substrate.

Conventional coating systems use either a resistance heated element or an electron beam to heat the evaporant in the crucible. Electron beam evaporation is preferred over resistive evaporation due to its ability to operate at lower ambient pressures during deposition, its superior deposition rate control, and its multiple source capability. In a coating system utilizing electron beam evaporation, an electron gun is disposed within the vacuum chamber which generates an electron beam. The electron beam is directed toward the evaporant thereby heating the material and producing a vapor transport cloud.

Although electron beam evaporation has several advantages, there is at least one significant drawback. During electron beam evaporation, the evaporant can be approximated as a point source at the substrate surface. What this means is that the amount of material deposited on a substrate per unit of time (evaporation rate) is inversely proportional to the square of the distance from the source to the substrate. Thus, in order to obtain a uniform coating across the entire substrate the substrate assemblies must be hemispherical in shape. A substrate assembly having a hemispherical shape allows each portion of the substrate to be positioned an equal distance away from the source thereby achieving a uniform evaporation rate and uniform coating across the entire substrate.

However, hemispherical substrate assemblies do not lend themselves to "in-line" processing which has significant advantages over "batch-type" systems. When utilizing a batch-type system, the main vacuum chamber must be evacuated and vented to atmosphere after processing each batch of substrates. This has caused serious production delays due to the significant time it takes to evacuate the chamber vacuum after each use. In contrast, during in-line processing the substrates are placed on carriers and continuously conveyed through the system in an expeditious manner. A minimal amount of labor is needed to operate such a system. As noted above, conventional hemispherical substrate assemblies used in conjunction with electron beam evaporation cannot obtain the advantages afforded by in-line processing. In-line processing is not possible in these systems because the substrate must remain in a neutral position in order to achieve uniform coating.

Unlike traditional electron beam evaporation, RF and DC sputter deposition are capable of being used in conjunction with in-line processing. In use, conventional sputter deposition techniques provide two plates having an inert gas, such as argon, disposed between them. On one plate is mounted a substrate and on the other is a target material containing the coating material. A high radio frequency (RF) is impressed across the two plates causing the inert gas atoms to become ionized. The ionized gas atoms strike the target plate containing the coating material knocking off molecules which are then deposited on the substrate. Since sputtering is capable of being used in conjunction with in-line processing, it is presently the technique of choice for coating large flat panel displays.

However, RF and DC sputtering do not have some of the significant advantages offered by electron beam evaporation. In particular, electron beam evaporation has excellent deposition rate control, multiple source ability, and is capable of operating at lower ambient pressures. In addition, sputtering has a higher cost of equipment and operation as well as a slower rate of deposition when compared to electron beam evaporation.

Thus, a need exists to provide a vacuum coating device using electron beam evaporation that is capable of applying a uniform coating on a substrate while at the same time obtaining the significant benefits of in-line processing.

SUMMARY OF THE INVENTION

A new and improved apparatus and method is provided for using an electron beam evaporation assembly to apply a highly uniform film deposition onto large area substrates during line-of-sight deposition processes, such as in-line processing, e-beam processing, ion source processing, etc.

In accordance with one embodiment of the present invention, the apparatus includes a vacuum chamber. A track having a top surface and a bottom surface is enclosed by the vacuum chamber. A stage carrying a deposition source is adapted to slide from side to side across a length of the track. A conveyor is mounted in an upper portion of the vacuum chamber for transporting a substrate through the vacuum chamber. At least a portion of the conveyor is in a line of sight of the deposition source.

In accordance with another embodiment of the present invention, the apparatus includes a vacuum chamber. A track having a top surface and a bottom surface is enclosed by the vacuum chamber. A generally planar platter having a top face and a bottom face is operatively connected to the top surface of the track and is adapted to slide from side to side across the length of the track. A stage carrying an electron beam evaporator is mounted on a top face of the platter causing the stage and the electron beam evaporator to slide with the platter along the longitudinal axis of the track. A linear substrate feed assembly for transporting a substrate through the vacuum chamber is positioned above the stage carrying the electron beam evaporator. At least a portion of the substrate is in a line of sight of the electron beam evaporator as the substrate travels through the feed assembly.

In accordance with another aspect of the present invention, a method is provided for applying a highly uniform film deposition onto a substrate. A track having a top surface and a bottom surface is enclosed within a vacuum chamber. A slidable stage carrying a deposition source is mounted above the top surface of the track. The stage carrying the deposition source is slid from side to side across the length of the top surface of the track. A linear substrate feed assembly is mounted above the stage carrying the deposition source. A substrate is uniformly coated by the deposition source as the substrate is transported through the vacuum chamber along the linear substrate feed assembly.

A principal advantage of the present invention is provided by the ability to apply a highly uniform coating on a substrate using electron beam evaporation without having to use a hemispherical substrate assembly.

Another advantage of the present invention resides in the provision of an electron beam evaporation system capable of use during in-line processing.

BRIEF DESCRIPTION OF THE DRAWINGS

The invention may take form in various components and arrangements of components. The drawings are only for purposes of illustrating a selected embodiment and are not to be construed as limiting the invention.

DETAILED DESCRIPTION OF THE PREFERRED EMBODIMENT

Figure 1:
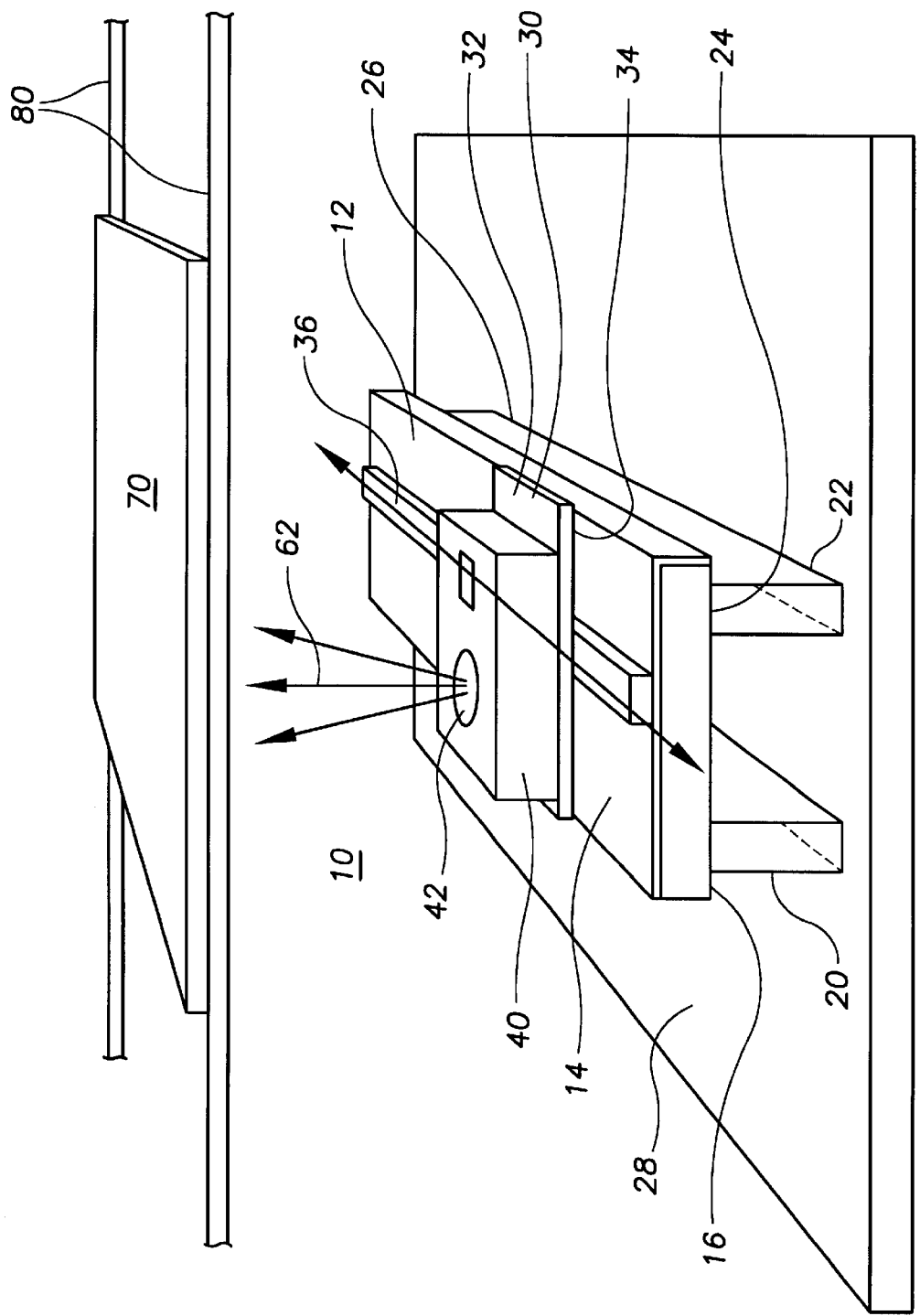
FIG. 1 is a schematic cross-sectional view of the vacuum coating system in accordance with the present invention.

Referring now to the drawings, which illustrate a selected embodiment of the invention only and are not intended to limit same, FIG. 1 shows a desired arrangement of the components of a vacuum chamber 10 in accordance with the present invention. It will be appreciated, however, that other orientations of the components can be obtained in accordance with the teachings of this invention.

The vacuum chamber 10 encloses a track 12. The track 12 is rectangular in shape having a top surface 14 and a bottom surface 16 both of which are substantially planar. A pair of legs 20, 22 each having a top edge 24 and a bottom edge 26 are operatively associated with the bottom surface 16 of the track. The top edge 24 of the legs are in direct contact with the bottom surface of the track. The bottom edge 26 of the legs are mounted to a lower portion 28 of the vacuum chamber 10. The legs 22, 24 are disposed parallel to one another and are arranged longitudinally along the bottom surface of the track. In use, the legs operate to support the track within the vacuum chamber 10. Although two legs are preferred for supporting the track, it will be understood that any supporting mechanism may be used without departing from the scope and intent of the present invention.

In the preferred embodiment, a platter 30 is adapted to slide from side to side across the length of the track. The platter is planar having a top face 32 and a bottom face 34. An elongated rail 36 is mounted on the top surface 14 of the track for guiding the platter 30 across the length of the track. The elongated rail 36 is positioned between the bottom face 34 of the platter 30 and the top surface 14 of the track and extends along the central longitudinal axis of the top surface 14 of the track 10. The platter has a pair of rollers (not shown) which straddle the rail 36 and secure the platter 30 to the rail. It will be understood, however, that any mechanism which adequately guides the platter 30 and secures the platter 30 to the track is within the scope of the present invention.

With continued reference to FIG. 1, a stage 40, carrying a deposition source 42, is mounted on the top face 32 of the platter 30. As such, the stage 40 and the deposition source slide from side to side with the platter 30 along the central longitudinal axis of the track 12. The stage 40 provides adequate room for a quartz crystal thickness monitor if desired. The deposition source 42 is preferably an electron beam evaporator consistent with those well known in the art.

Figure 2:
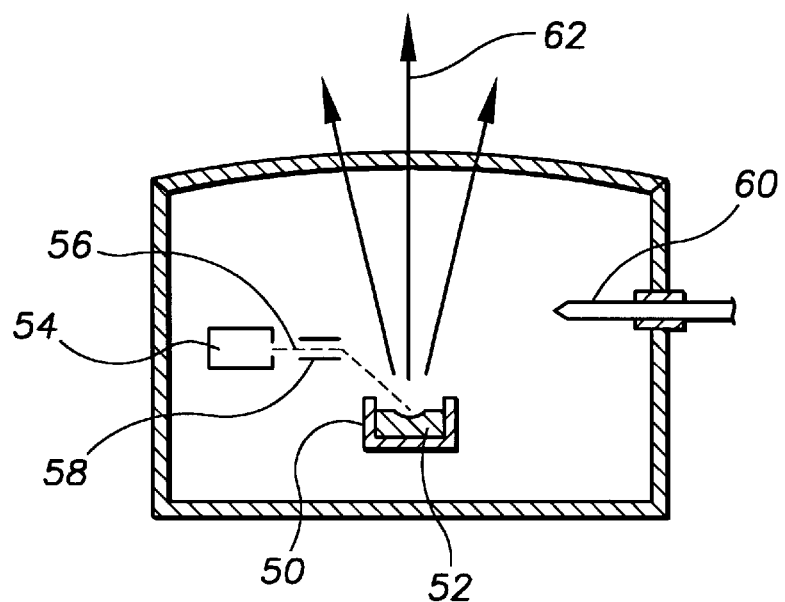
FIG. 2 is a cross-sectional elevational view of an electron beam evaporation system in accordance with the present invention.

Referring now to FIG. 2, an electron beam evaporator system typically includes a water-cooled boat or crucible 50 which contains a material 52, such as molten metal. An electron gun 54, positioned adjacent the crucible 50, is also carried by the stage 40. It should be noted, however, that the electron gun 54 and the crucible 50 may be formed from a single unit. In the illustrated embodiment, the electron gun 54 generates an electron beam 56 which is directed by a deflector system 58 toward the material 52. The electron beam 56 heats the material causing the material to evaporate thereby generating a vapor source. Optionally, the evaporated material is ionized by an ion gun 60 to help form the material that is to be deposited on a substrate 70. The deposition material 62 is transmitted upward from the deposition source 42 toward a substrate 70 as illustrated in FIG. 1.

Figure 3:
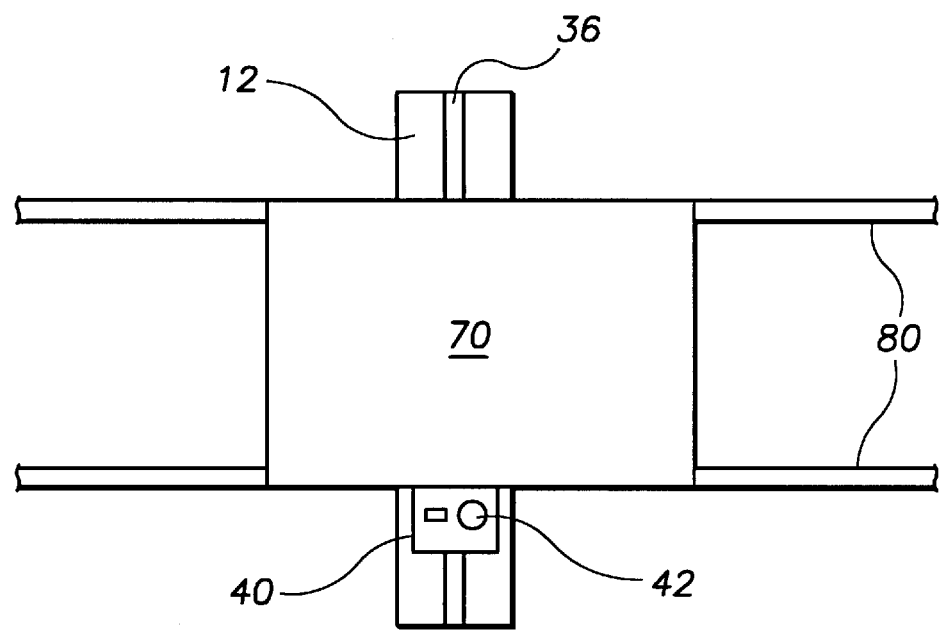
FIG. 3 is a top view of the vacuum coating system in accordance with the present invention.

In FIG. 3, a conveyor or linear substrate feed assembly 80 is mounted above the track 12. The feed assembly 80 transports a substrate 70 through the vacuum chamber 10. The feed assembly 80 is an "in-line" processing system capable of continuously feeding multiple substrates through the vacuum coating chamber 10 one after the other. In-line processing systems are well known in the art and will not be explained any further.

In operation, the linear substrate feed assembly carries a substrate 70 into the vacuum chamber 10. As the substrate begins to travel through the chamber, the platter 30, carrying the stage 40 and the electron beam evaporator 42, slides from side to side along the track 12 underneath the substrate 70. The slide direction of the stage is perpendicular to the direction of travel of the substrate. As the electron beam evaporator moves back and forth across the track, it transmits evaporated material 62 upward which is then deposited onto the substrate. The substrate preferably moves less than three inches along the feed assembly for every two passes of the stage. In addition, the length of the track is greater than the width of the substrate. Therefore, the stage carrying the electron beam evaporator 42 travels back and fourth underneath the entire width of the substrate.

By providing a deposition source 40 that moves from side to side underneath the entire width of the substrate, a constant evaporation rate can be achieved without having to use a hemispherical substrate assembly. The raster motion of the stage allows the deposition source to apply a substantially uniform deposition over the entire surface to be coated. Laboratory tests have proven that adjusting the rate of motion, so that the substrate travels no more than three inches for every two passes of the evaporator, will enable the vacuum coating system to achieve a deposition rate that is constant within a reasonable variation over the entire substrate surface. As such, the present invention is capable of applying a highly uniform coating to substrates while using electron beam evaporation and in-line processing.

The invention has been described with reference to the preferred embodiment. Obviously, modifications and alterations will occur to others upon a reading and understanding of this specification. The invention is intended to include all such modifications and alterations in so far as they come within the scope of the appended claims and equivalents thereof.

What is claimed is:

1. A vacuum coating system capable of applying a film onto moving substrates comprising:

a vacuum chamber;

a track having a top surface and a bottom surface enclosed by the vacuum chamber;

a stage carrying a line-of-sight deposition source adapted to slide from side to side above the top surface of the track across a length of the track; and a continuous in-line feed assembly mounted in an upper portion of the vacuum chamber for transporting the substrates through the vacuum chamber while the deposition source is activated, at least a portion of the conveyor being in a line of sight of the deposition source.

2. The vacuum coating system according to claim 1, wherein the deposition source is an electron beam evaporator.

3. The vacuum coating system according to claim 1, further comprising a platter operatively connected to the top surface of the track having a top face and a bottom face, the top face of the platter engaging a bottom side of the stage thereby allowing the platter to slide with the stage and support the stage as the stage moves across the length of the track.

4. The vacuum coating system according to claim 3, further comprising an elongated rail operatively connecting the platter to the top surface of the track and guiding the platter across the length of the track, the rail being positioned between the bottom face of the platter and the top surface of track and extending along a longitudinal axis of the top surface of the track.

5. The vacuum coating system according to claim 4, wherein the elongated rail on the top surface of the track has a length greater than a width of the substrate thereby allowing the deposition source to travel under the entire width of the substrate and apply a uniform coating to the entire substrate.

6. The vacuum coating system according to claim 1, wherein the stage carrying the deposition source slides across the length of the track a distance greater than a width of the substrate.

7. The vacuum coating system according to claim 1, wherein the stage slides from side to side across the length of the track in a direction perpendicular to a direction of travel of the substrate as the substrate moves through the vacuum chamber along the conveyor.

8. The vacuum coating system according to claim 1, wherein the substrate travels less than three inches along a longitudinal axis of the conveyor for every two times the stage passes a same portion of the substrate.

9. The vacuum coating system according to claim 1, further comprising at least one leg engaging the bottom surface of the track for supporting the track within the vacuum chamber.

10. A vacuum coating system capable of applying a film onto moving substrates comprising:

a vacuum chamber;

a track having a top surface and a bottom surface enclosed by the vacuum chamber;

a generally planar platter having a top face and a bottom face, the platter being operatively connected to the top surface of the track and adapted to slide from side to side across a length of the track;

a stage carrying an electron beam evaporator mounted on the top face of the platter thereby causing the stage and the electron beam evaporator to slide with the platter across the length of the track; and a continuous in-line feed assembly for transporting the substrates through the vacuum chamber positioned above the stage carrying the electron beam evaporator so that at least a portion of the substrates are in a line of sight of the electron beam evaporator as the substrates travel through the feed assembly.

11. The vacuum coating system according to claim 10, further comprising an elongated rail operatively connecting the platter to the top surface of the track and guiding the platter across the length of the track, the rail being positioned between the bottom face of the platter and the top surface of track and extending along a longitudinal axis of the top surface of the track.

12. The vacuum coating system according to claim 11, wherein the elongated rail on the top surface of the track has a length greater than a width of the substrate thereby allowing the electron beam evaporator to travel under the entire width of the substrate and apply a uniform coating to the entire substrate.

13. The vacuum coating system according to claim 10, wherein the stage carrying the deposition source slides across the length of the track a distance greater than a width of the substrate.

14. The vacuum coating system according to claim 10, wherein the stage slides from side to side across the length of the track in a direction perpendicular to a direction of travel of the substrate as the substrate moves through the vacuum chamber along the feed assembly.

15. The vacuum coating system according to claim 10, wherein the substrate travels less than three inches along a longitudinal axis of the conveyor for every two times the stage passes a same portion of the substrate.

16. The vacuum coating system according to claim 10, further comprising at least one leg engaging the bottom surface of the track for supporting the track within the vacuum chamber.

17. A vacuum coating system capable of applying a film onto moving substrates comprising:

a vacuum chamber;

a deposition source housed by the vacuum chamber adapted to slide from side to side within the housing and apply a uniform coating on to the substrates, and a continuous in-line feed assembly for conveying substrates through the vacuum chamber while the deposition source is being applied to the substrates.

18. A vacuum coating system according to claim 17 further comprising a stage disposed within the vacuum chamber and adapted to carry the deposition source as the deposition source slides from side to side within the vacuum chamber.

* * * * *